(12) United States Patent
Shintani et al.

(10) Patent No.: US 6,661,472 B2
(45) Date of Patent: *Dec. 9, 2003

(54) CHANNEL SELECTION IN DIGITAL TELEVISION

(75) Inventors: Peter Rae Shintani, San Diego, CA (US); Shigeharu Kondo, San Diego, CA (US)

(73) Assignees: Sony Corporation, Tokyo (JP); Sony Electronics Inc., Park Ridge, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/406,541

(22) Filed: Sep. 27, 1999

(65) Prior Publication Data

US 2003/0133050 A1 Jul. 17, 2003

Related U.S. Application Data

(60) Provisional application No. 60/102,942, filed on Sep. 30, 1998.

(51) Int. Cl.[7] .......................... H04N 5/445; H04N 5/54; H04N 7/00; H04N 5/50
(52) U.S. Cl. ...................... 348/732; 348/731; 348/569; 348/563; 725/57; 725/56
(58) Field of Search .................................. 348/731, 734, 348/385.1, 386.1, 569, 906, 563, 553, 732, 570; 725/56, 44, 151, 20, 57

(56) References Cited

U.S. PATENT DOCUMENTS

| | | | | | |
|---|---|---|---|---|---|
| 4,746,983 | A | * | 5/1988 | Hakamada | 348/565 |
| 5,200,823 | A | * | 4/1993 | Yoneda et al. | 348/473 |
| 5,438,377 | A | * | 8/1995 | Chang | 348/731 |
| 5,465,113 | A | * | 11/1995 | Gilboy | 725/29 |
| 5,515,106 | A | * | 5/1996 | Chaney et al. | 348/461 |
| 5,592,213 | A | * | 1/1997 | Yoshinobu et al. | 725/131 |
| 5,600,378 | A | * | 2/1997 | Wasilewski | 348/468 |
| 6,002,394 | A | * | 12/1999 | Schein et al. | 725/39 |
| 6,078,348 | A | * | 6/2000 | Klosterman et al. | 725/40 |
| 6,137,539 | A | * | 10/2000 | Lownes et al. | 348/569 |
| 6,249,320 | B1 | * | 6/2001 | Schneidewend et al. | 348/569 |
| 6,313,886 | B1 | * | 11/2001 | Sugiyama | 348/731 |
| 6,369,861 | B1 | * | 4/2002 | Lownes | 348/731 |
| 6,396,549 | B1 | * | 5/2002 | Weber | 348/734 |

FOREIGN PATENT DOCUMENTS

| | | | |
|---|---|---|---|
| WO | WO 96/37999 | 11/1996 | H04N/7/00 |
| WO | WO 98/44630 | 10/1998 | H03J/1/00 |

OTHER PUBLICATIONS

PCT International Search Report (4 pages).

* cited by examiner

Primary Examiner—Michael H. Lee
Assistant Examiner—Paulos M. Natnael
(74) Attorney, Agent, or Firm—John L. Rogitz

(57) ABSTRACT

Methods and apparatus implementing a technique for selecting a channel in a digital television. In one implementation, selecting a channel includes: receiving a major and minor channel number sequence, including a major channel number, a delimiter, and a minor channel number, where the delimiter separates the major channel number and the minor channel number; identifying a physical channel which corresponds to the major and minor channel number sequence by accessing a channel look up table, where the channel look up table includes correspondences between major and minor channel number sequences and physical channels; identifying a virtual channel table which corresponds to the physical channel, where the virtual channel table indicates a virtual channel which corresponds to the major and minor channel number sequence; tuning to the physical channel to receive a signal carried on the physical channel; and decoding the virtual channel from the tuned signal.

18 Claims, 7 Drawing Sheets

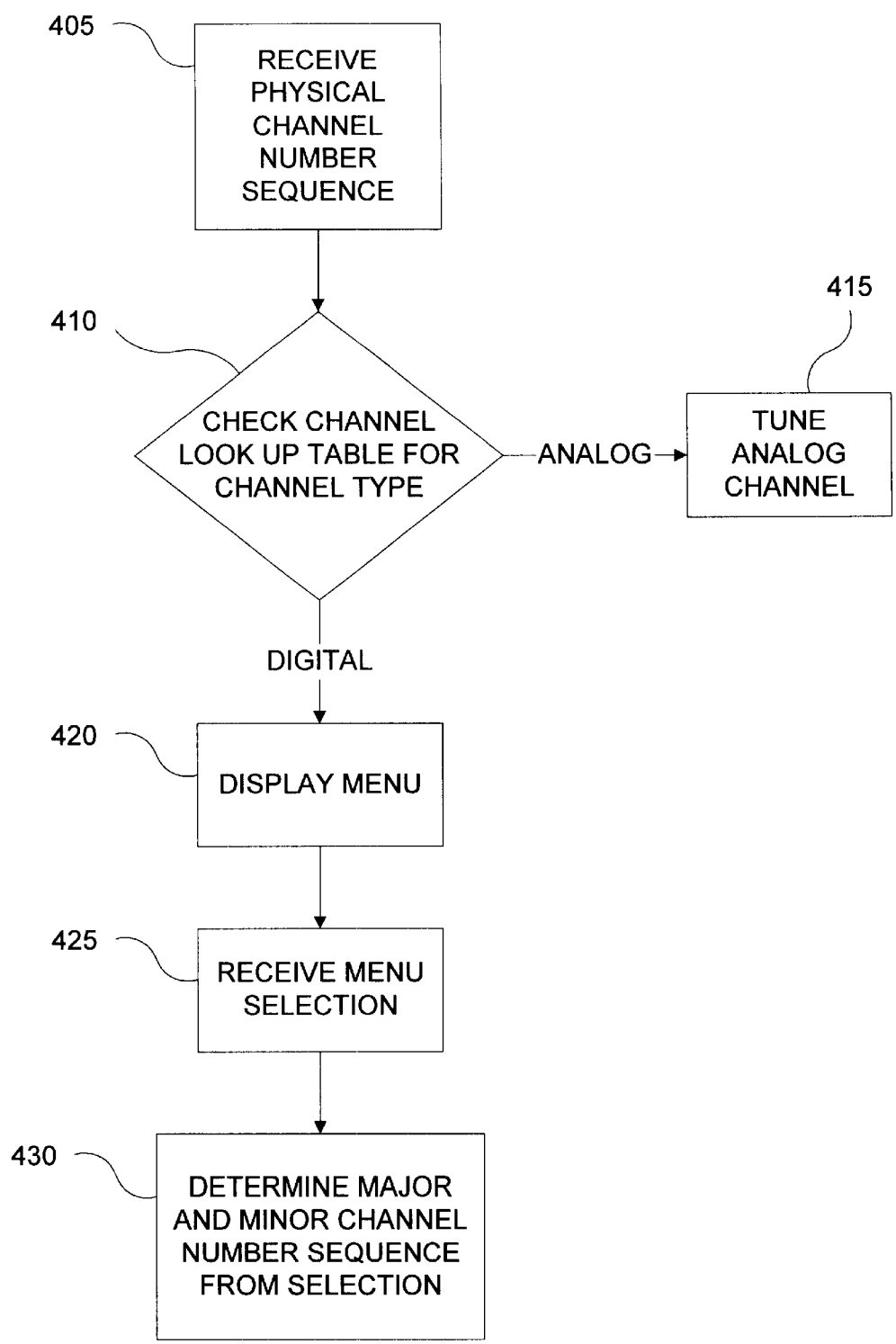

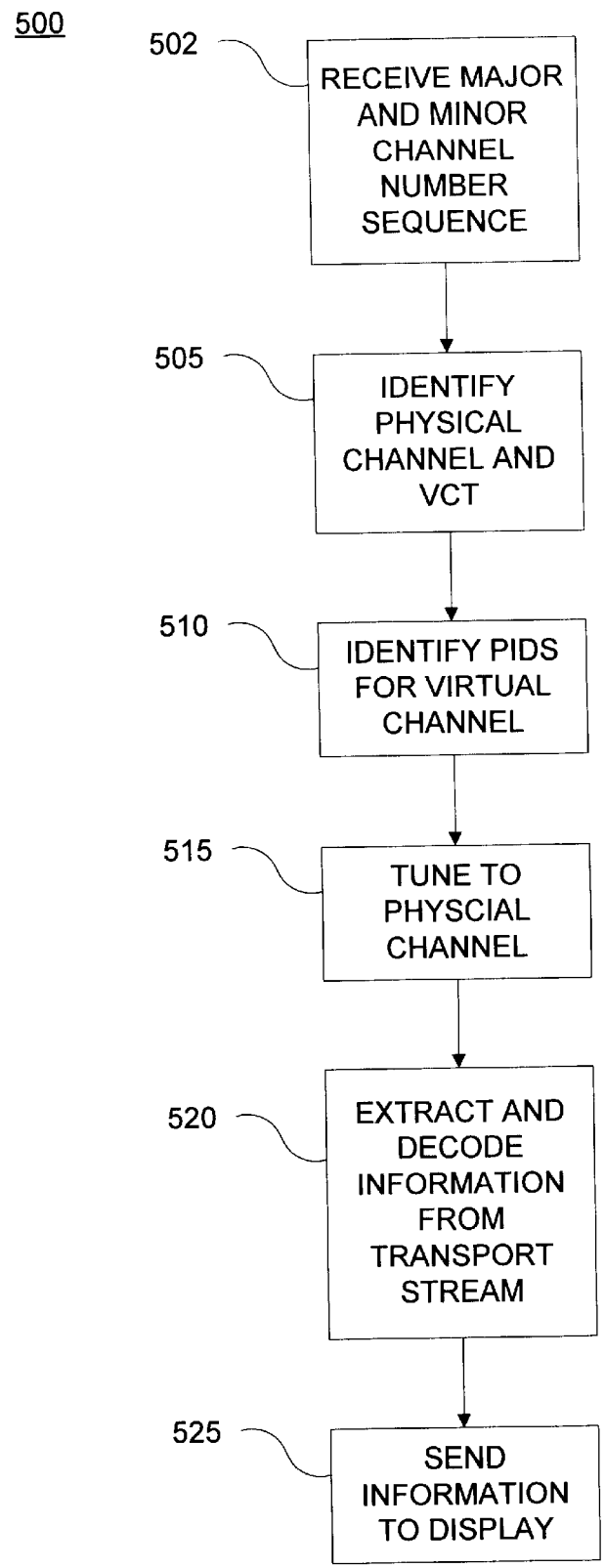

CHANNEL SELECTION IN DIGITAL TELEVISION

This application claims the benefit of U.S. Provisional Application No. 60/102,942, filed Sep. 30, 1998.

BACKGROUND

To view a television program being transmitted to a user's television, the user provides a channel number to the television. In conventional analog broadcast television, this channel number is a reference to a particular frequency band at which the analog signal carrying the television program is broadcast. This frequency band is also referred to as a "physical channel." The channel number identifies from which frequency band a tuner in the television is to receive. Thus, a channel number indicates a physical channel and the associated program.

In digital broadcast television, a frequency band can carry a signal which is an encoded digital transport stream. When decoded, the transport stream can include one or more streams having various forms of content, such as video or audio for a program, text based information, closed captioning, or any information which can be transmitted digitally. Each of these items can be associated with a different channel number. Accordingly, a single physical channel can include multiple items or "virtual channels." In this case, a channel number refers to a virtual channel, a particular item encoded within a transport stream, instead of referring to a physical channel.

In addition, content in a transport stream can be related to content broadcast as an analog signal or in a different transport stream. For example, a transport stream can include a high definition television ("HDTV") version of a program that is also broadcast as an analog signal at a different unrelated frequency band.

SUMMARY

The invention provides methods and apparatus implementing a technique for selecting a channel in a digital television. In one implementation, selecting a channel includes: receiving a major and minor channel number sequence, including a major channel number, a delimiter, and a minor channel number, where the delimiter separates the major channel number and the minor channel number; identifying a physical channel which corresponds to the major and minor channel number sequence by accessing a channel look up table, where the channel look up table includes correspondences between major and minor channel number sequences and physical channels; and identifying a virtual channel table which corresponds to the physical channel, where the virtual channel table indicates a virtual channel which corresponds to the major and minor channel number sequence. Selecting a channel can further include: tuning to the physical channel to receive a signal carried on the physical channel; and decoding the virtual channel from the tuned signal.

In another aspect, an input device for selecting a channel in a digital television includes: a keypad including a plurality of number keys for inputting respective numbers; and a delimiter key for inputting a delimiter, where a channel is indicated by a major and minor channel number sequence which includes a major channel number input through one or more number keys of the keypad, a delimiter input through the delimiter key, and a minor channel number input through one or more number keys of the keypad.

In another aspect, a digital television includes: a display; a tuner including a connection for an externally supplied broadcast signal, where the tuner provides a signal carried on a physical channel selected from the broadcast signal; a channel control circuit which derives major and minor channel number sequences from received control signals, where a major and minor channel number sequence indicates a specific channel carried in the broadcast signal; a channel processing circuit connected to the channel control circuit, the display, and the tuner, where the channel processing circuit causes the tuner to select a physical channel corresponding to the major and minor channel number sequence supplied by the channel control circuit and provide a digital signal carried thereon, decodes a channel indicated by the major and minor channel number sequence in the digital signal, and supplies the decoded channel to the display.

BRIEF DESCRIPTION OF THE DRAWINGS

FIG. 4 is a flowchart of a process for selecting a virtual channel through a menu shown on a display.

FIG. 5 is a flowchart of a process for processing major and minor channel number sequences in a digital television.

DETAILED DESCRIPTION

The Advanced Television System Committee ("ATSC") established a standard protocol for transmission of data tables for use with digital television. This protocol is referred to as the Program and System Information Protocol ("PSIP") and is described in "Program and System Information Protocol for Terrestrial Broadcast and Cable," document A/65, Dec. 23, 1997 published by the ATSC. The information describing the content of a transport stream for a physical channel is referred to as the PSIP for that physical channel.

In digital television, each channel in a transport stream is a virtual channel associated with a major channel number and a minor channel number. A major channel number can be used to identify channels which belong to a common broadcast corporation or other group. A minor channel number specifies a particular channel in such a group. In one example, all the virtual channels in a transport stream have the same major channel number and have respective minor channel numbers. In addition, virtual channels can have as a major channel number the channel number of a physical channel carrying a related analog channel (analog channels do not need minor channel numbers). In another example, a program is transmitted as an analog signal on physical channel 2. The HDTV version of the same program is transmitted in a transport stream, such as within an unrelated frequency band on a different physical channel, and the virtual channel for that HDTV program has the major channel number 2. Thus, a physical channel can be indicated by a major channel number and a virtual channel can be indicated by a major and minor channel number pair.

The PSIP describes the information for all the virtual channels in a transport stream. The PSIP includes a virtual channel table ("VCT") which describes the correspondence between major and minor channel numbers and the virtual channels. A digital television uses the VCT to interpret a user's input to select the appropriate major and minor channel number and hence the desired virtual channel.

Figure 1A:
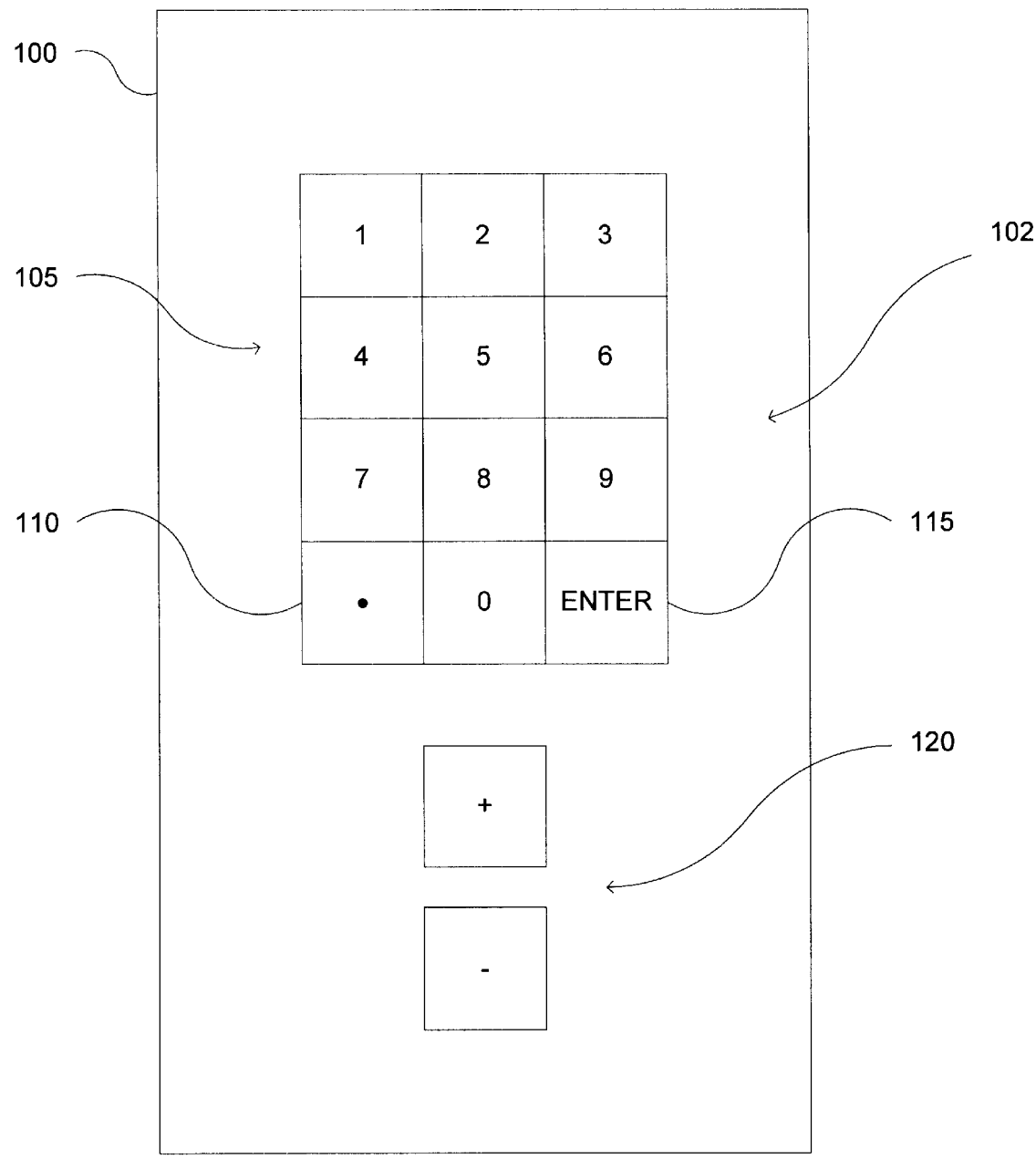
FIG. 1A shows a hand-held remote control which provides efficient input of major and minor channel numbers to select a channel on a digital television.

FIG. 1A shows an implementation of an input device as a hand-held remote control 100 which provides efficient input of major and minor channel numbers to select a channel on a digital television. Remote control 100 includes at least one keypad 102. Keypad 102 includes one or more number keys 105, such as 10 number keys labeled 0–9, a delimiter key 110, an enter key 115, and one or more channel command keys 120, such as keys labeled with plus ("+") and minus ("−"). In an alternative implementation, a keypad includes alphanumeric keys so that a user can enter combinations of letters and/or numbers to identify a channel, such as "SNN.HDTV". Alphanumeric labels can be set by the user or provided automatically, such as through a broadcast signal in a transport stream.

A user enters channel numbers by depressing one or more number keys 105. A user indicates the separation between a major channel number and a minor channel number by depressing delimiter key 110. A sequence of a major channel number, a delimiter, and a minor channel number is a major and minor channel number sequence. Because delimiter key 110 is provided on remote control 100, a user can conveniently enter a major and minor channel number sequence to access a specific channel directly.

Delimiter key 110 is marked with a delimiter. In FIG. 1A, delimiter key 110 is marked with a dot ("."). This delimiter can take any form, for example, and not by way of limitation, a slash ("/"), a space (" "), or a dash ("-"). The choice of a dot as the delimiter is advantageous as being a familiar break in numeric representation in the decimal system. In one implementation, the delimiter is implemented as a predetermined break or arrangement of memory storage, rather than a separately stored character. In another implementation, the delimiter is indicated by inputting a major channel number with a first keypad and a minor channel number with a second keypad (shown in FIG. 1B).

To complete a channel number entry, the user can depress enter key 115. An automatic timeout can also complete a channel number entry if the user does not depress any key for a specified period. The user enters channel commands by depressing one of one or more channel command keys 120, such as to change to a sequentially adjacent channel. For example, in one implementation, to change from the current channel to the sequentially next channel, the user can depress a channel command key 120 marked with a plus ("+").

Figure 1B:
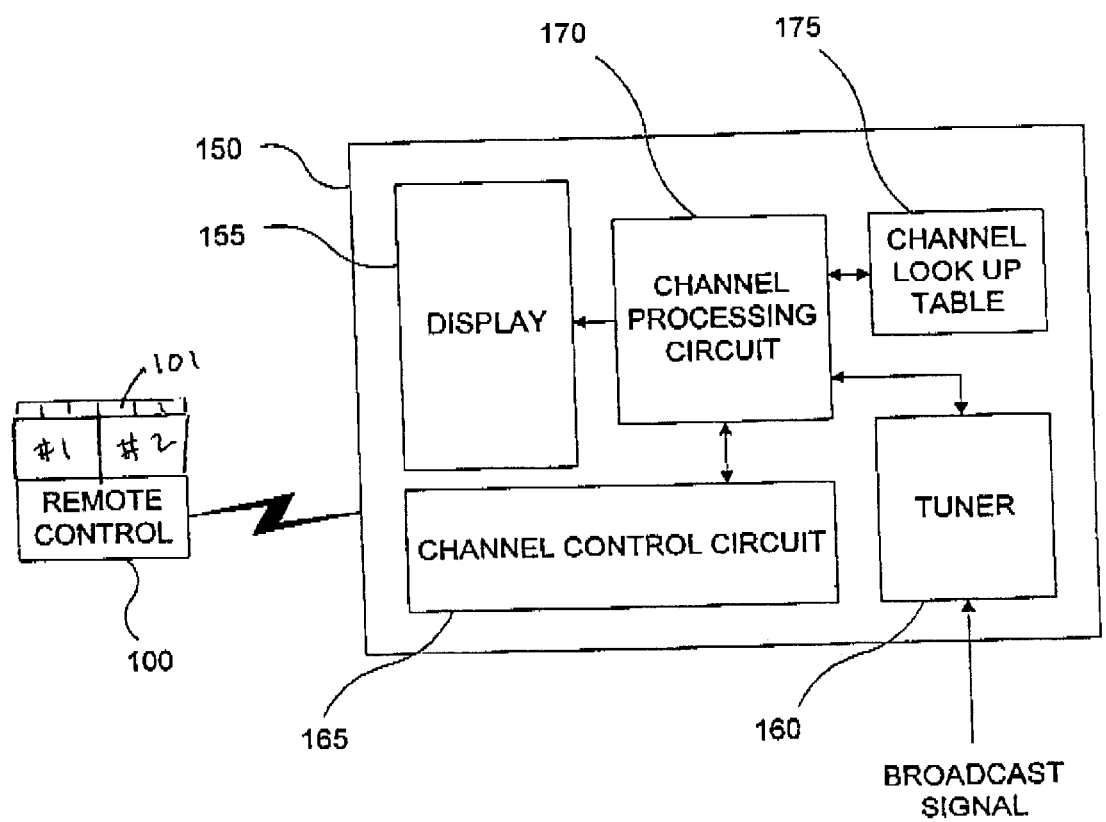
FIG. 1B shows a remote control and a digital television.

FIG. 1B shows remote control 100 and a digital television 150, with the control 100 potentially having one or more keypads (two shown) and alphabet keys 101. Digital television 150 includes a display 155, such as a cathode ray tube ("CRT"), a tuner 160, a channel control circuit 165, and a channel processing circuit 170. These components can be implemented separately or in combination. In one implementation, digital television 100 also includes an integrated keypad for entry of channel numbers and commands directly into digital television 150.

Remote control 100 sends control signals to digital television 150 according to keys depressed by the user. Channel control circuit 165 receives the control signals. Channel control circuit 165 recognizes channel commands or combinations of channel numbers and delimiters to select a desired physical or virtual channel. For example, in an implementation where the delimiter is a dot, channel control circuit 165 recognizes the sequence "4.2" as a request for major channel number 4 and minor channel number 2. Channel selection is described further below with respect to FIGS. 2A through 5. Channel control circuit 165 provides channel information, such as major and minor channel numbers, to channel processing circuit 170.

Channel processing circuit 170 uses the channel information from channel control circuit 165 and information stored in a channel look up table 175 to determine the desired physical or virtual channel. Channel look up table 175 is implemented as writeable memory, such as RAM or flash ROM. Channel processing circuit 170 creates channel look up table 175 during initialization of digital television 150 and updates channel look up table 175 dynamically. Channel look up table 175 defines correspondences between major and minor channel numbers and physical and virtual channels. The allocation of minor channel numbers is derived from information obtained from the PSIP of digital physical channels. Major channel numbers correspond to physical channels, which may be different from the physical channels carrying the transport streams. Channel look up table 175 also indicates whether each physical channel is an analog channel or a digital channel.

Channel processing circuit 170 causes tuner 160 to select a physical channel from a broadcast signal received at digital television 150. The broadcast signal can be received through various reception systems, such as an antenna, a cable system (e.g., CATV), or a satellite system (e.g., DSS). Tuner 160 provides a signal on the selected physical channel to channel processing circuit 170.

When the channel information indicates a physical channel is desired, such as an analog channel, channel processing circuit 170 passes the signal from tuner 160 to display 155 unchanged. When the channel information indicates a virtual channel is desired, channel processing circuit 170 performs appropriate digital signal processing to extract information from a transport stream based on information supplied in the VCT. For example, channel processing circuit 170 can extract and decode, using decoding such as MPEG-2, a video signal and an audio signal from a transport stream which corresponds to a desired virtual channel. Channel processing circuit 170 provides the signal or signals to display 155.

Figure 2A:
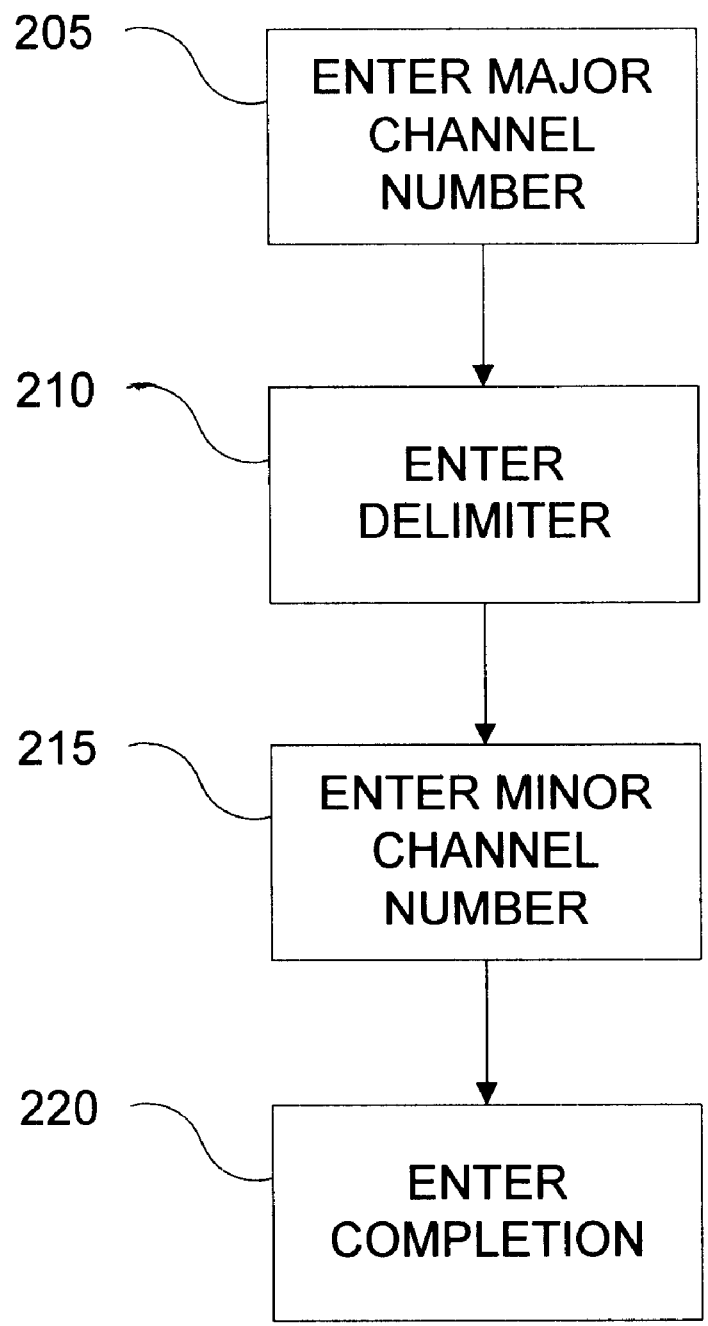
FIG. 2A is a flowchart of a process for directly entering channel numbers for a major and minor channel number sequence using a keypad.

FIG. 2A is a flowchart of a process 200 for directly entering channel numbers for a major and minor channel number sequence using a keypad, such as keypad 102 shown in FIG. 1A. A user enters a major channel number by depressing an appropriate number key or keys 105 (205). The user enters a delimiter by depressing delimiter key 110 (210). As discussed above, the delimiter indicates the end of the major channel number. For example, the delimiter allows a user to enter directly and distinguishably the sequences "42.3" and "4.23." The user enters a minor channel number by depressing an appropriate number key or keys 105 on remote control 100 (215). The user completes the sequence by depressing enter key 115 (220). The major channel number, delimiter, and minor channel number can be supplied to the channel control circuit separately or together.

Figure 2B:
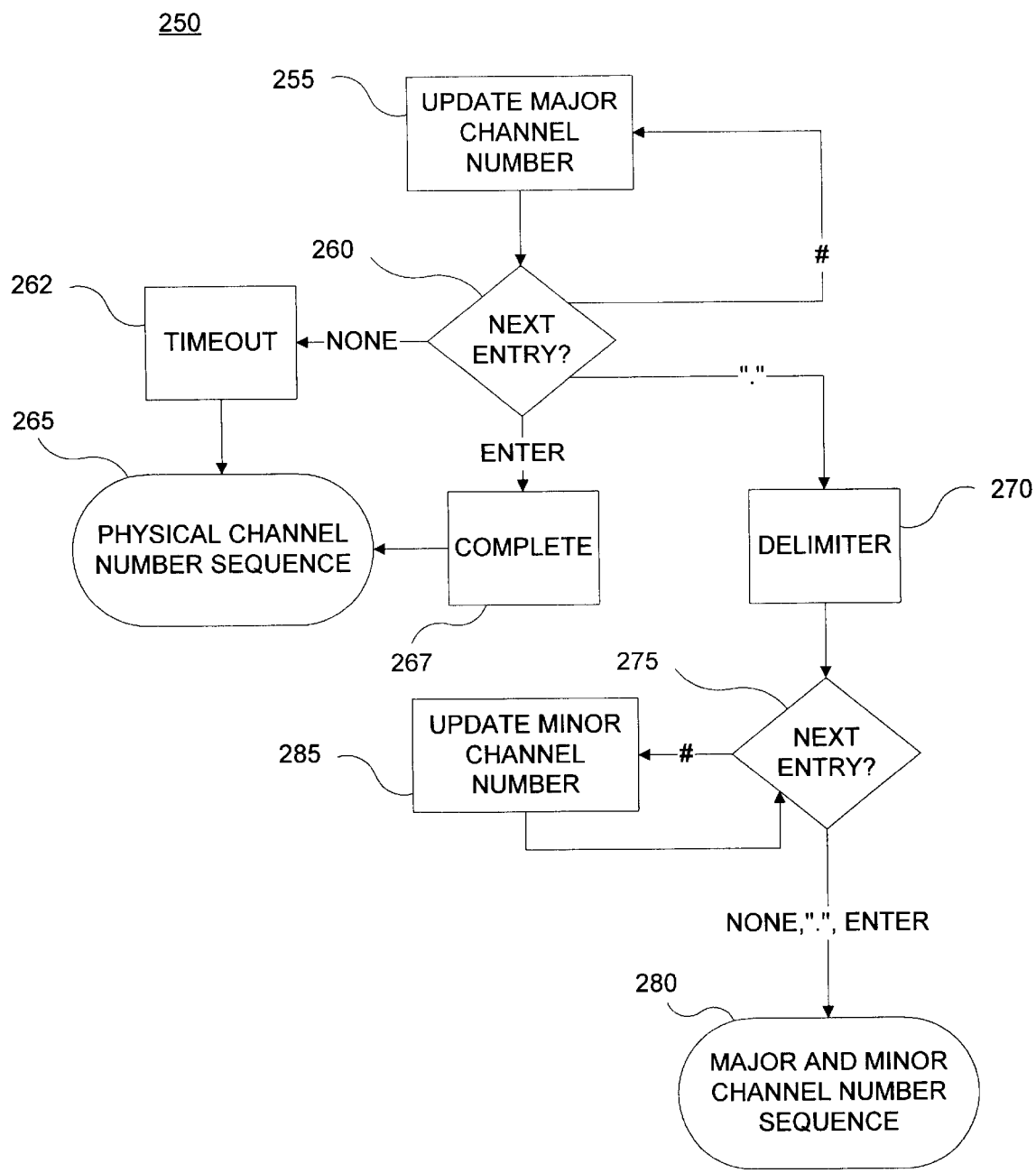
FIG. 2B is a flowchart of a process for processing number sequences entered using a keypad.

FIG. 2B is a flowchart of a process 250 for processing number sequences entered using a keypad, such as keypad 102 shown in FIG. 1A, to generate a channel number sequence in a digital television, such as in channel control circuit 165 shown in FIG. 1B. As described above, a major and minor channel number sequence includes a major channel number, a delimiter, and a minor channel number. A physical channel number sequence includes a channel number.

When channel control circuit 165 receives an entry of a channel number, and is not already processing another channel number sequence, channel control circuit stores the received number as the first digit of a current channel number (255). Channel control circuit 165 causes display 155 to display the received channel number and entries as entries are received for user feedback. Channel control circuit 165 waits to receive another entry for a specified timeout period (260). If channel control circuit 165 does not receive another entry before the timeout period expires (262), channel control circuit 165 passes the current channel number to channel processing circuit 170 as a physical channel number sequence (265). If channel control circuit 165 receives a completion signal, such as from enter key 115, before the timeout period expires (267), channel control circuit 165 passes the current channel number to channel processing circuit 170 as a physical channel number sequence (265).

If channel control circuit 165 receives another channel number before the timeout period expires, channel control circuit 165 concatenates the new channel number with the current channel number as the next digit (255). Channel control circuit 165 resets the timeout period to wait for another entry (260).

If channel control circuit 165 receives a delimiter before the timeout period expires, channel control circuit 165 concatenates the delimiter with the current channel number (270). Channel control circuit 165 resets the timeout period to wait for another entry (275).

If channel control circuit 165 does not receive another entry before the timeout period expires, channel control circuit 165 passes the current channel number to channel processing circuit 170 as a major and minor channel number sequence (280). If the current channel number ends with a delimiter, channel control circuit 165 concatenates a default value, such as zero, with the current channel number before passing the current channel number to channel processing circuit 170.

Similarly, if channel control circuit 165 receives a completion signal, such as from enter key 115, or a second delimiter before the timeout period expires, channel control circuit 165 passes the current channel number to channel processing circuit 170 as a major and minor channel number sequence (280). If the current channel number ends with a delimiter, channel control circuit 165 concatenates a default value, such as zero, with the current channel number before passing the current channel number to channel processing circuit 170.

If channel control circuit 165 receives another channel number before the timeout period expires, channel control circuit 165 concatenates the new channel number with the current channel number as the next digit (285). Channel control circuit 165 resets the timeout period to wait for another entry (275).

For example, to select physical channel 2, an analog channel, a user enters "2" with a number key 105 and then "ENTER" with enter key 115 using remote control 100 as shown in FIG. 1A. To select virtual channel 4.2—the virtual channel which has major number channel 4 and minor channel number 2—a user enters "4" with a number key 105, "." with delimiter key 110, and then "2" with a number key 105.

Figure 3:
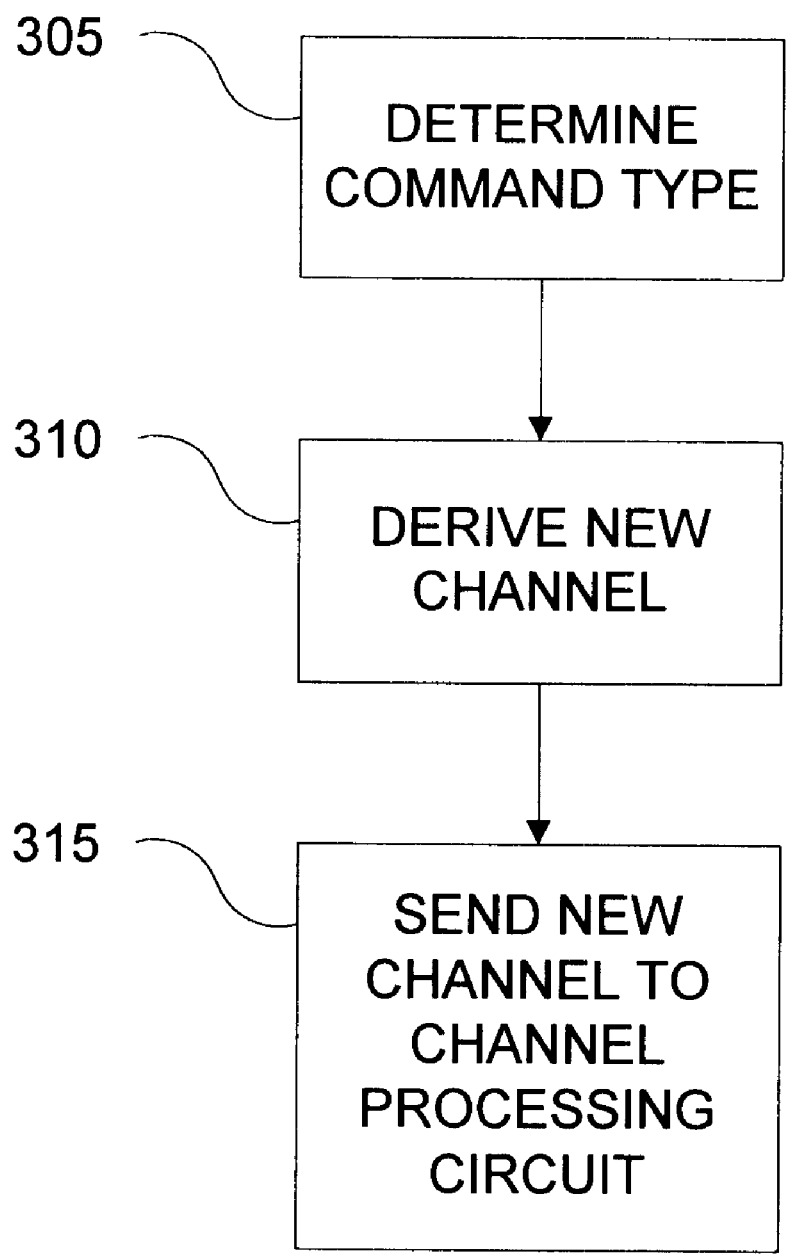
FIG. 3 shows a process for selecting a channel using channel commands.

FIG. 3 shows a process 300 for selecting a channel using channel commands, such as using channel command keys 120 as shown in FIG. 1A. When channel control circuit 165 receives a channel command, channel control circuit 165 determines the type of command (305). Channel control circuit 165 recognizes a predetermined set of commands, such as those which are available through remote control 100. Channel control circuit 165 processes the channel command to derive the desired channel (310). Channel control circuit passes the resulting channel number to channel processing circuit 170 as a channel number sequence (315).

An analog channel is sequentially before virtual channels with the same major channel number as the channel number of the analog channel. For example, when channel control circuit 165 has received a "+" command and the currently displayed channel is 4, channel control circuit 165 sends a request to channel processing circuit 170 for the next sequential channel. Channel processing circuit 170 checks whether virtual channel 4.1 is available and, if not, whether analog channel 5 is available, and so on. Channel processing circuit 170 returns the resulting channel number to channel control circuit 165, or alternatively can process the channel number directly.

FIG. 4 is a flowchart of a process 400 for selecting a virtual channel through a menu shown on a display, such as display 155 shown in FIG. 1B. When channel processing circuit 170 receives a physical channel number sequence from channel control circuit 165 (405), channel processing circuit 170 checks in the channel look up table 175 whether the selected physical channel is a digital or analog channel (410). If the physical channel is an analog channel, channel processing circuit 170 causes the tuner 160 to tune to the physical channel to display the broadcast signal on display 150 (415).

If the physical channel is a digital channel, channel processing circuit 170 causes display 150 to display a menu listing one or more virtual channels associated with that physical channel (420). To generate the menu, channel processing circuit 170 accesses the VCT of the transport stream on the physical channel. Alternatively, channel processing circuit 170 generates a full channel list of all the channels, virtual and analog, that have the same major channel number as the major channel number which corresponds to the selected physical channel.

In one implementation, channel processing circuit 170 always generates a full channel list for the selected physical channel, whether the physical channel is analog or digital. For example, in the case of an analog physical channel, channel processing circuit 170 obtains the major channel number corresponding to the selected analog physical channel from the channel look up table 175. Channel processing circuit 170 forms the full channel list by searching channel look up table 175 for all the virtual channels which have that major channel number.

Channel processing circuit 170 receives a selection from the menu made by the user (425). The user can select entries from menus in various ways, such as by using channel command keys 120 shown in FIG. 1A. Channel processing circuit 170 uses channel look up table 175 to find major and minor channel numbers corresponding to the selected entry and uses these numbers as a major and minor channel number sequence (430).

FIG. 5 is a flowchart of a process 500 for processing major and minor channel number sequences in a digital television, such as digital television 150 shown in FIG. 1B. After receiving a major and minor channel number sequence (502), channel processing circuit 170 identifies a physical channel and VCT associated with that sequence using channel lookup table 175 (505). For example, upon receiving the major and minor channel number sequence "4.2" (i.e., a sequence having major and minor channel numbers 4 and 2, respectively), channel processing circuit 170 accesses channel lookup table 175 to determine the associated physical channel, such as physical channel 39. Channel processing circuit 170 also accesses the VCT for physical channel 39, such as through a pointer to the VCT stored in channel lookup table 175. Channel processing circuit 170 retrieves one or more packet identifiers ("PIDs") from the accessed VCT for packets in the transport stream on the selected physical channel which correspond to the selected virtual channel (510). As described above, a major and minor channel number sequence indicates a virtual channel. A single virtual channel can have associated multiple information streams. For example, the VCT may indicate that video data for the selected virtual channel has one PID and audio data has another PID.

Channel processing circuit 170 causes tuner 160 to tune to the selected physical channel (515). Channel processing circuit 170 extracts and decodes appropriate information from the signal received on the tuned physical channel using the retrieved PID or PIDs (520). Channel processing circuit 170 supplies this information to display 155 (525). Channel processing circuit 170 can also supply audio or other information to appropriate components of digital television 150.

The invention can be implemented in, or in combinations of, digital electronic circuitry, computer hardware, firmware, or software. An implementation can include one or more stored computer programs executable by a programmable system including a programmable processor and memory.

In the implementations described above, information describing virtual channels and mapping between channel numbers and virtual channels and physical channels is carried in the PSIP of digital channels. In alternative implementations, however, this information can be supplied in various ways or in a combination of ways. This mapping information can be provided by out-of-band ("OOB") signaling, such as in CATV. Alternatively, the mapping information can be provided by in-band signals, such as program guide and mapping information provided on a portion of an analog or digital channel. The information can be provided in real time or periodically, on a single channel or multiple channels. For example, in one such implementation, the channel processing circuit of a digital television builds the channel look up table by combining the mapping information received on multiple channels. A person of ordinary skill in the art will know how to modify the components of the digital television described above to accommodate one or more of these alternative information sources, such as by including additional tuners or software to access and store the mapping information.

In another alternative implementation, the channel selection is used to select a channel without tuning to that channel. For example, a user can select a channel as described above for recording at some future time. In this case, the digital television does not necessarily tune to the selected channel at the time of selection.

This disclosure describes numerous implementations of the invention. However, these implementations are illustrative and not limiting. Additional variations are possible and will be apparent to one of ordinary skill in the appropriate art.

What is claimed is:

1. A digital television, comprising:
   a display;
   a tuner including a connection for an externally supplied broadcast signal, where the tuner provides a signal carried on a physical channel selected from the broadcast signal;
   a channel control circuit which derives major and minor channel number sequences from received control signals, where a major and minor channel number sequence indicates a specific channel carried in the broadcast signal;
   a channel processing circuit connected to the channel control circuit, the display, and the tuner, where the channel processing circuit
      determines, when a physical channel indicated at least by the major channel number is digital, a major and minor channel number sequence by displaying a list of channels associated with the physical channel;
      receives a selection of a minor channel from the list, and
      generates a major and minor channel number sequence based thereon.

2. The digital television of claim 1, where the received control signals include a major channel number, a delimiter, and a minor channel number.

3. The digital television of claim 1, where the received control signals include a major channel number and a menu selection which indicates a minor channel number.

4. The digital television of claim 1, where the channel processing circuit comprises a channel look up table which indicates correspondences between major and minor channel number sequences and physical channels.

5. The digital television of claim 4, where the channel look up table further indicates correspondences between major and minor channel number sequences and channels encoded in digital signals carried in the broadcast signal.

6. The digital television of claim 4, further comprising an integrated keypad for inputting the received control signals.

7. The digital television of claim 4, further comprising an input device which includes a keypad for inputting the received control signals.

8. A method for selecting a channel in a digital television, comprising:
   inputting a major channel number which indicates a first physical channel carried on a broadcast signal;
   determining whether the physical channel is digital;
   if the physical channel is digital, presenting a list at least of minor channel numbers associated at least with the physical channel;
   using the list, inputting a minor channel number such that a major and minor channel number sequence can be generated therefrom.

9. The method of claim 1, where the second physical channel is the same as the first physical channel.

10. The method of claim 1, further comprising inputting a completion command to complete selecting a channel.

11. The method of claim 1, further comprising transmitting the major channel number, the delimiter, and the minor channel number to a digital television.

12. The method of claim 11, where the major channel number, the delimiter, and the minor channel number are transmitted to the digital television together.

13. The method of claim 1, where the digital signal is a transport stream.

14. The method of claim 13, where a correspondence between the minor channel number and the channel is provided by a virtual channel table carried in the transport stream.

15. A method for selecting a channel in a digital television, comprising:
   receiving a physical channel number sequence which indicates a physical channel which has a corresponding major channel number;
   identifying the physical channel as analog or digital;
   when the physical channel is digital, determining a major and minor channel number sequence by
      displaying a menu listing one or more channels associated with the physical channel,
      receiving a selection from the menu, where the selection corresponds to a channel which has a corresponding minor channel number, and
      generating a major and minor channel number sequence from the major channel number corresponding to the physical channel and the minor channel number corresponding to the selection.

16. The method of claim 15, further comprising tuning to the physical channel corresponding to the major and minor channel number sequence.

17. The method of claim 15, further comprising, when the physical channel is analog, causing a tuner to tune to the physical channel to supply a signal carried on the physical channel to a display.

18. A system for selecting a channel in a digital television, comprising:
   means for receiving a physical channel number sequence which indicates a physical channel which has a corresponding major channel number;
   means for identifying the physical channel as analog or digital;
   means for causing a tuner to tune to the physical channel to supply a signal carried on the physical channel to a display when the physical channel is analog;
   means for determining a major and minor channel number sequence when the physical channel is digital, by
      displaying a menu listing one or more channels associated with the physical channel,
      receiving a selection from the menu, where the selection corresponds to a channel which has a corresponding minor channel number, and
      generating a major and minor channel number sequence from the major channel number corresponding to the physical channel and the minor channel number corresponding to the selection.

* * * * *